United States Patent
Chang

(10) Patent No.: US 10,243,025 B2
(45) Date of Patent: Mar. 26, 2019

(54) DISPLAY DEVICE INCLUDING A LIGHT SOURCE UNIT AT A PAD AREA OF A FIRST SUBSTRATE

(71) Applicant: SAMSUNG DISPLAY CO., LTD., Yongin, Gyeonggi-Do (KR)

(72) Inventor: Se-In Chang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 237 days.

(21) Appl. No.: 14/446,208

(22) Filed: Jul. 29, 2014

(65) Prior Publication Data
US 2015/0185527 A1     Jul. 2, 2015

(30) Foreign Application Priority Data

Dec. 27, 2013  (KR) .................. 10-2013-0165539

(51) Int. Cl.
| | |
|---|---|
| *H01L 27/32* | (2006.01) |
| *H01L 51/52* | (2006.01) |
| *G02F 1/1333* | (2006.01) |

(52) U.S. Cl.
CPC ...... *H01L 27/323* (2013.01); *G02F 1/133308* (2013.01); *H01L 51/524* (2013.01); *H01L 51/5237* (2013.01); *H01L 51/5246* (2013.01); *G02F 2001/133311* (2013.01); *G02F 2001/133331* (2013.01); *G02F 2201/086* (2013.01); *G02F 2202/023* (2013.01); *G02F 2202/28* (2013.01); *H01L 27/3276* (2013.01)

(58) Field of Classification Search
CPC combination set(s) only.
See application file for complete search history.

(56) References Cited

U.S. PATENT DOCUMENTS

| | | | |
|---|---|---|---|
| 2006/0072315 A1 | 4/2006 | Han et al. | |
| 2008/0198297 A1* | 8/2008 | Choi | G02B 6/0031 349/65 |
| 2011/0227487 A1* | 9/2011 | Nichol | G02B 6/0018 315/158 |
| 2011/0242467 A1* | 10/2011 | Kim | G02F 1/133308 349/113 |
| 2012/0162938 A1 | 6/2012 | Kim et al. | |
| 2013/0127776 A1* | 5/2013 | Guard | G06F 3/0412 345/174 |
| 2014/0028931 A1* | 1/2014 | Tsurusaki | G06F 3/041 349/12 |

FOREIGN PATENT DOCUMENTS

| | | | | |
|---|---|---|---|---|
| KR | 10-0727613 B1 | 6/2007 | | |
| KR | 10-2011-0111749 A | 10/2011 | | |
| KR | 10-2012-0075165 A | 7/2012 | | |
| WO | WO-2012-141071 | * 10/2012 | | G02F 3/041 |

* cited by examiner

*Primary Examiner* — Lauren Nguyen
(74) *Attorney, Agent, or Firm* — Lewis Roca Rothgerber Christie LLP

(57) ABSTRACT

A display device includes: a first substrate including a display area and a pad area; a second substrate facing the first substrate; a touch unit on the second substrate; a window on the touch unit, the window covering the display area and the pad area; an adhesive layer between the window and the touch unit and under the window at the pad area; and a first light source unit under the window at the pad area.

19 Claims, 6 Drawing Sheets

DISPLAY DEVICE INCLUDING A LIGHT SOURCE UNIT AT A PAD AREA OF A FIRST SUBSTRATE

CROSS-REFERENCE TO RELATED APPLICATION

This application claims priority to and the benefit of Korean Patent Application No. 10-2013-0165539, filed on Dec. 27, 2013 in the Korean Intellectual Property Office, the disclosure of which is incorporated herein in its entirety by reference.

BACKGROUND

1. Field

Aspects of embodiments of the present invention relate to a display device.

2. Description of the Related Art

In general, flat panel displays, such as liquid crystal displays and organic light emitting diode displays, include a pair of electric field generating electrodes and an electro-optical active layer interposed therebetween. In the liquid crystal display, a liquid crystal layer is included as the electro-optical active layer, and in the organic light emitting diode display, an organic light emitting layer is included as the electro-optical active layer.

One of the pair of electric field generating electrodes is generally coupled to (e.g., connected to) a switching element so as to receive an electric signal. The electro-optical active layer converts the electric signal into an optical signal so that an image is displayed.

Such flat panel displays have a structure in which a protective window is formed on a panel on which the image is realized. The panel and the window are bonded to each other by an adhesive layer, and then light is irradiated from above the window so as to cure the adhesive layer so that the panel and the window are firmly joined to each other. The adhesive layer may include a resin.

A black matrix is formed in the window so as to cover an edge of an image region of the panel. However, because light irradiated from the outside of the panel does not readily pass through the black matrix, the resin under the black matrix is not well-cured, and thus, a bonding defect between the panel and the window is likely to occur.

In order to solve this problem, according to a recently presented method, light is irradiated not only from above the window but also from sides of the window so as to eliminate a region in which light is blocked by the black matrix.

However, even light irradiated from the sides of the window is blocked by a flexible printed circuit board (FPCB), and thus, the light frequently fails to reach a pad region in which the FPCB is mounted. The FPCB electrically couples (e.g., electrically connects) the panel and a controller and is highly flexible, and thus, when the FPCB is bent depending on a position of the controller, sides of the resin may be blocked by the FPCB. In this case, the resin may not be fully cured because the light irradiated from the sides is blocked by the FPCB and fails to be incident on the resin.

Accordingly, there is an increasing demand for a solution capable of effectively curing the adhesive layer in the pad area of a display device.

SUMMARY

Aspects of embodiments of the present invention are directed toward a display device. Further, aspects of embodiments of the present invention are directed toward a display device that can effectively prevent or reduce a bonding defect due to a window by allowing light to be irradiated to an entire region of a resin so as to cure the resin.

According to an embodiment of the present invention, a display device includes a first substrate including a display area and a pad area, a second substrate facing the first substrate, a touch unit on the second substrate, a window on the touch unit, the window covering the display area and the pad area, an adhesive layer between the window and the touch unit and under the window at the pad area, and a first light source unit under the window at the pad area.

The first light source unit may include an ultraviolet (UV) light source.

The display device may further include a first connector (e.g., a first connection unit) coupled to the first substrate at the pad area.

The first light source unit may be on an one surface of the first connector.

The first connector may include a flexible printed circuit board (FPCB).

The display device may further include a second connector (e.g., a second connection unit) coupled to the second substrate and may be coupled to the touch unit.

The first light source unit may be on at least one surface of the second connector.

The second connector may include a FPCB.

The display device may further include a second connector coupled to the second substrate and may be coupled to the touch unit.

The display device may further include a second light source unit on at least one surface of the second connector.

The display device may further include a third light source unit, and the second light source unit may be on a surface of the second connector and the third light source unit may be on another surface of the second connector.

The window may include a black matrix covering the pad area.

The touch unit may be at a location corresponding to the display area.

The display device may further include a polarizer between the touch unit and the window.

The first light source unit may have a height in a range of about 0.1 mm to about 1 mm.

The first light source unit may be configured to emit light along a direction normal to the first substrate or may be configured to emit light along a direction parallel to the first substrate.

The first light source unit may include a light source, a housing, and a molding portion.

The molding portion may be configured to direct light emitted from the light source in a direction.

According to aspects of embodiments of the present invention, the display device may allow window-bonding resin to be completely cured throughout the entire display device, including the pad area of the display device, and, thus, may greatly reduce the bonding defect of the window caused by non-cured resin.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Figure 1:
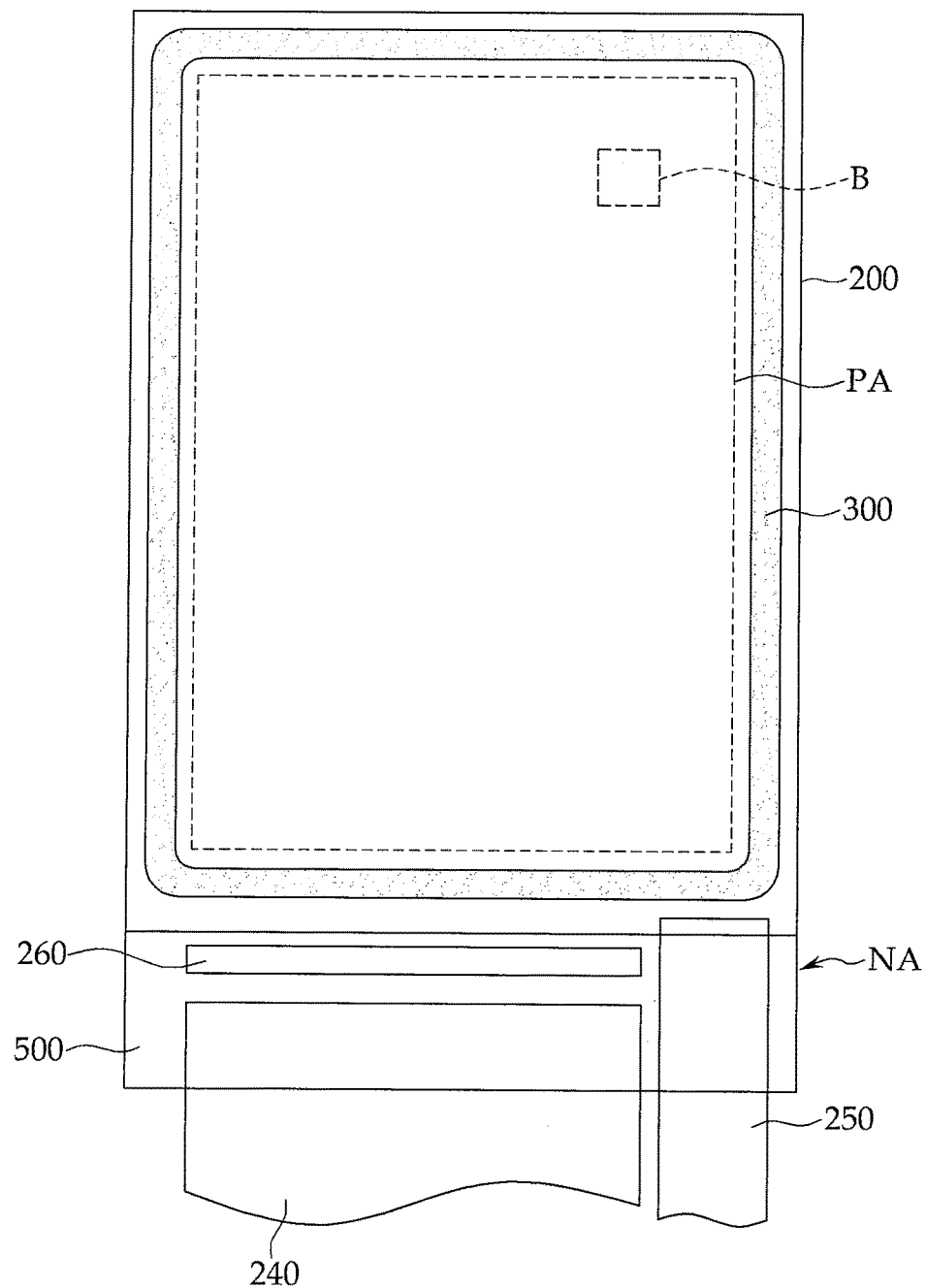
FIG. 1 is a schematic plan view illustrating a configuration of a display device according to an embodiment of the present invention.

Characteristics and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete and will fully convey the scope of the invention to those skilled in the art. However, the present invention should not be limited to the embodiments described herein. Well-known constituent elements, operations, and techniques are not described in detail in the embodiments in order to prevent the present invention from being obscurely interpreted. Like reference numerals refer to like elements throughout the specification.

The spatially relative terms, such as "below", "beneath", "lower", "above", "upper", and the like, may be used herein for ease of description to describe the relationship between one element or component and another element or component as illustrated in the drawings. It will be understood that the spatially relative terms are intended to encompass different orientations of the device in use or operation, in addition to the orientation depicted in the drawings. For example, when a device shown in the drawing is turned over, a device positioned "below" or "beneath" another device would then be "above" another device. Accordingly, the illustrative term "below" may include both the lower and upper positions. The device may also be oriented in any other direction, and thus, the spatially relative terms may be interpreted differently depending on the orientations.

The terminology used herein is for the purpose of describing particular embodiments only and is not construed as limiting the invention. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of the mentioned component, step, operation, and/or element but do not exclude the presence or addition of one or more additional components, steps, operations, and/or elements. Further, the use of "may" when describing embodiments of the present invention refers to "one or more embodiments of the present invention."

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a display device according to an embodiment of the present invention will be described in detail with reference to FIGS. 1 to 3. According to the embodiment of the present invention, the display device may be an organic light emitting diode (OLED) display or a liquid crystal display (LCD). Hereinafter, the display device will be described as the OLED display.

FIG. 1 is a schematic plan view illustrating a configuration of a display device 10 according to an embodiment of the present invention. FIG. 2 is a cross-sectional view of curing an adhesive layer by irradiating light toward a conventional display device. FIG. 3 is a cross-sectional view illustrating a display device according to an embodiment of the present invention.

Figure 3:
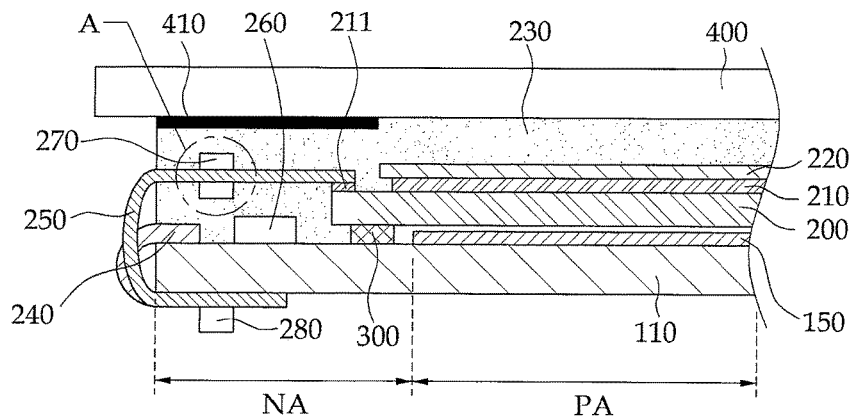
FIG. 3 is a cross-sectional view illustrating a display device according to an embodiment of the present invention.

Referring to FIGS. 1 and 3, according to an embodiment of the present invention, the display device 10 includes a first substrate 110, a display unit 150, a second substrate 200, a touch unit 210, a polarizer 220, an adhesive layer 230, a first connection unit 240 (e.g., a first connector), a second connection unit 250 (e.g., a second connector), a driving unit 260 (e.g., a driver), a light source unit 270, a touch driving unit 280 (e.g., a touch driver), a window 400, and a black matrix 410. The first substrate 110, the display unit 150, the second substrate 200, the touch unit 210, and the polarizer 220 are collectively called a display panel.

As illustrated in FIG. 1, the display device 10 includes the first substrate 110 divided into a display area PA and a pad area NA. The first substrate 110 may be made of a transparent material (such as an $SiO_2$-based glass material), but it is not limited thereto. The first substrate 110 may also be made of a transparent plastic material. A plurality of pixels are formed in the display area PA of the first substrate 110 to display images, and one or more driving units 260 may be disposed in the pad area NA.

The first substrate 110 may further include a scan driver and a data driver that are configured to drive the pixels. Further, the first substrate 110 may further include pad electrodes in the pad area NA. The driving unit 260 may be mounted in the pad area NA of the first substrate 110 by a chip-on-glass (COG) method so as to be electrically coupled to (e.g., electrically connected to) the pad electrodes. The first substrate 110 may further include wires configured to connect the driving unit 260, the scan driver, and the data driver together. However, the driving unit 260 may not be disposed in the pad area NA or may be omitted from the display panel. A buffering member configured to protect the driving unit 260 from external impact may be further disposed in the pad area NA. The driving unit 260 may be a driver integrated circuit (IC).

The display unit 150 is disposed on the first substrate 110 and is coupled to (e.g., connected to) the driving unit 260. The display unit 150 includes an organic light emitting diode (OLED). However, the display unit 150 may include another element that may serve as a display element.

The second substrate 200 is opposite to (e.g., faces) the first substrate 110 and is joined to (e.g., combined with) the first substrate 110 by a sealant 300. The second substrate 200 is configured to cover the display unit 150 for protection. The second substrate 200 may be made of glass or a transparent, synthetic resin film (such as an acryl) and, further, metals may be included in the second substrate 200. For instance, the second substrate 200 may be made of any one of polyethylene (PET) film, polypropylene (PP) film, a polyamide (PA) film, polyacetal (POM or polyoxymethylene) film, poly(methyl methacrylate) (PMMA) film, polybutylene terephthalate (PBT) film, a polycarbonate (PC) film, a cellulose film, and/or a moisture-proof cellophane.

The second substrate 200 may be smaller in area than the first substrate 110. Therefore, the pad area NA of the first substrate 110 may be exposed by (e.g., may not be covered by) the second substrate 200.

A conventionally or generally used sealant (e.g. a sealing glass frit) may be utilized as the sealant 300.

The touch unit 210 is disposed on the second substrate 200 corresponding to the display area PA of the first substrate 110. The touch unit 210 includes first and second electrodes) that cross (e.g., intersect) each other. The first and second electrodes may be formed on the second substrate 200 in a matrix form with a plurality of rows and columns and may have an on-cell structure in which the first and second electrodes are patterned directly on a pixel of the second substrate 200. The first and second electrodes correspond to a touch sensor pattern. Further, the touch unit 210 may be a separately manufactured touch panel and may be disposed on the second substrate 200. The touch unit 210 includes a touch pad unit 211 on the second substrate 200. The touch driving unit 280 is configured to drive (e.g., configured to control) the touch unit 210 and is formed on the second connection unit 250.

The touch unit 210 senses touch performed by, for example, a pen and/or a user's finger and transmits a signal corresponding to a position where the touch is performed to the touch driving unit 280. The touch unit 210 may be used as an input to the display device 10 and may be resistive or capacitive.

The first connection unit 240 is coupled to the driving unit 260 to be coupled to the pad electrode on the first substrate 110 (e.g., the first connection unit 240 is coupled to the pad electrode on the first substrate 110 via the driving unit 260). For example, the first connection unit 240 may be a flexible printed circuit board (FPCB). For example, the first connection unit 240 may be mounted in the pad area NA by a chip-on-film (COF) method. The first connection unit 240 may include electronic devices configured to process driving signals and may further include a connector configured to transmit external signals to the driving unit 260. The electronic devices may include a plurality of components configured to drive the display device 10, and the plurality of components may include, for example, DC-DC converters.

The first connection unit 240 may be bent so as to cover one side (e.g., one edge) of the first substrate 110. The first connection unit 240 may be bonded to one surface of the first substrate 110 by double-sided tape that is interposed therebetween.

The second connection unit 250 is coupled to the touch pad unit 211 on the second substrate 200 to be coupled to the touch unit 210 (e.g., the second connection unit 250 is coupled to the touch unit 210 via the touch pad unit 211) and includes the touch driving unit 280. For example, the second connection unit 250 may be a FPCB. For example, the second connection unit 250 may be mounted on the touch pad unit 211 of the second substrate 200 by the chip-on-film (COF) method. The second connection unit 250 may include electronic devices configured to process driving signals and may further include a connector configured to transmit external signals to the touch driving unit 280. That is, the second connection unit 250 is configured to couple a sensor pattern of the touch unit 210 and the touch driving unit 280 together.

The second connection unit 250 may be bent so as to cover one side (e.g., one edge) of the first substrate 110. The second connection unit 250 may be bonded to one surface of the first substrate 110 by double-sided tape that is interposed therebetween. The touch driving unit 280 may be a touch driver IC.

The window 400 may be made of a transparent material (such as glass, resin, or the like) and is configured to protect a display panel from being broken or damaged by an external impact. For instance, the window 400 is disposed on the touch unit 210 and covers the display area PA and the pad area NA. The window 400 is bonded to the first substrate 110 and the second substrate 200 by the adhesive layer 230. The window 400 may be larger in size than the display panel, but it is not limited thereto. The window 400 may have substantially the same size as the display panel.

The black matrix 410 is disposed on an area of the window 400 corresponding to the pad area NA. The black matrix 410 includes a printing material that blocks a pattern under (e.g., on a lower part of) the window 400 from being visible. The printing material may be a black printing material, but a color of the printing material may vary depending on an intended design of the display device. The black matrix 410 includes a light absorbing material, such as chromium (Cr).

The polarizer 220 is disposed between the window 400 and the touch unit 210. The polarizer 220 is configured to prevent reflection of external light.

The adhesive layer 230 is disposed between the window 400 and the touch unit 210 and is configured to improve luminance, transmittance, reflectance, and visibility of the display device 10. Further, the adhesive layer 230 is disposed under the windows 400 at the pad area NA (e.g., the adhesive layer 230 is disposed between the window 400 and the pad area NA of the first substrate 110). The adhesive layer 230 may prevent an air gap from being formed between the window 400 and the first substrate 110 and between the window 400 and the second substrate 200 and may also may prevent foreign matter such as dust from penetrating into the display device 10. The adhesive layer 230 may include resin. The resin is a photo-curable resin. Hereinafter, the resin will be described as the adhesive layer 230.

A curing process of the resin 230 is as follows. An amount (e.g., a relatively small amount) of a photoinitiator is included in the resin 230 and is exposed to, for example, ultraviolet (UV) light so as to initiate a photo-polymerization reaction. Then, a monomer, which is a primary element of a resin-forming composition, and an oligomer are polymerized (e.g., instantaneously polymerized) to be cured. The monomer and the oligomer, which are primary elements of the resin 230, are in (e.g., are deposited in) a liquid state because they have low molecular weight, whereas the cured polymer has a solid state (e.g., a rigid state), because it has high molecular weight. Therefore, the liquid (e.g., the coated resin or ink) is cured to be a solid (e.g., a polymer).

Figure 2:
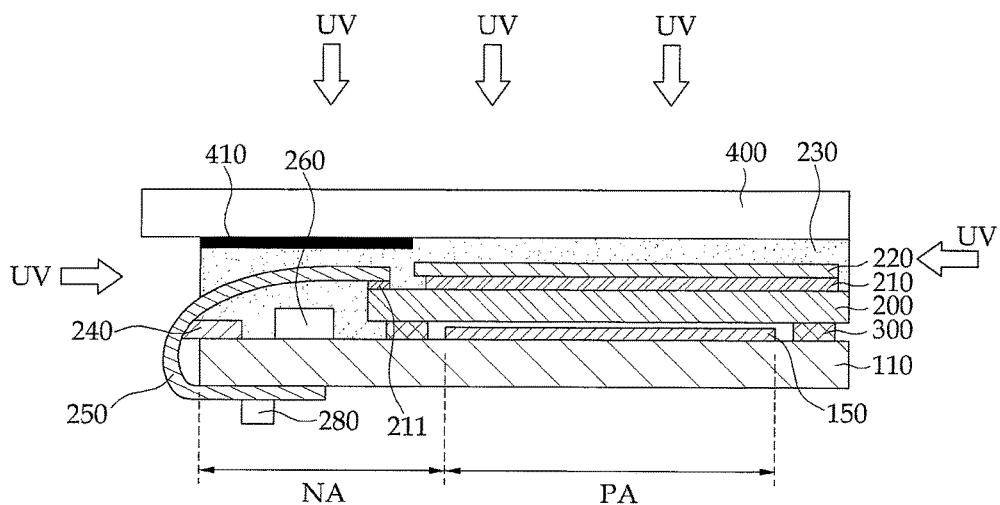
FIG. 2 is a cross-sectional view of curing an adhesive layer by irradiating light toward a conventional display device.

As illustrated in FIG. 2, the window 400 is bonded to the display panel, and the resin 230 is coated on the pad area NA of the first substrate 110 and the polarizer 220. The window 400 is bonded to the pad area NA of the first substrate 110 and the polarizer 220 by the resin 230 interposed therebetween. UV light is irradiated from above (e.g., from an upper surface of) and from a side surface of the window 400. The resin 230 is cured by the UV light so that the window 400 is firmly joined to (e.g., combined with) the display panel.

However, the resin 230 coated at the pad area NA may not be cured due to the black matrix 410 included in the window 400 and the first and second connection units 240 and 250 on the pad area NA. The first and second connection units 240 and 250 may be elastically deformed upward (e.g., deformed by a predetermined degree) while being bent because the first and second connection units 240 and 250 have flexibility and elasticity. An amount of the UV light incident on the resin 230 is reduced due to the elastically deformed portions of the first and second connection units 240 and 250 (e.g., portions of the first and second connection units 240 and 250 may prevent a portion of the resin 230 from being exposed to the UV light).

Accordingly, an embodiment of the display device 10 illustrated in FIG. 3 further includes the light source unit 270 configured to allow the resin 230 in the pad area NA to be cured (e.g., smoothly or completely cured).

As illustrated in FIG. 3, the light source unit 270 is disposed in the pad area NA. The light source unit 270 includes a light source (e.g., a UV light-emitting diode (LED)) and is configured to cure the resin 230. The light source unit 270 may be disposed on the second connection unit 250. The light source unit 270 may be disposed on the first connection unit 240 or may be disposed on both the first connection unit 240 and the second connection unit 250.

Hereinafter, according to an embodiment of the present invention, the light source unit 270 will be described in more detail with reference to FIGS. 4 to 6.

Figure 4:
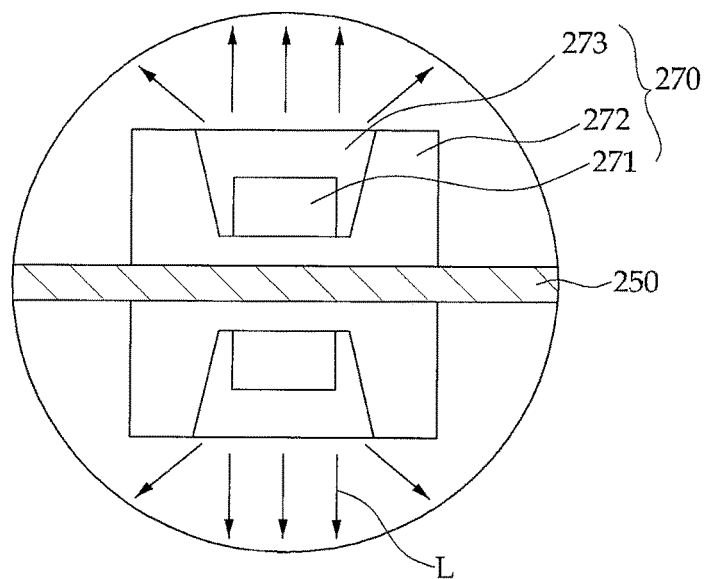
FIG. 4 is a cross-sectional view illustrating a light source unit according to an embodiment of the present invention.

FIG. 4 is a cross-sectional view of a light source unit according to an embodiment of the present invention. FIG. 5 is a cross-sectional view of a light source unit according to another embodiment of the present invention. FIG. 6 is a schematic plan view illustrating a light source unit mounted on the FPCB.

Figure 5:
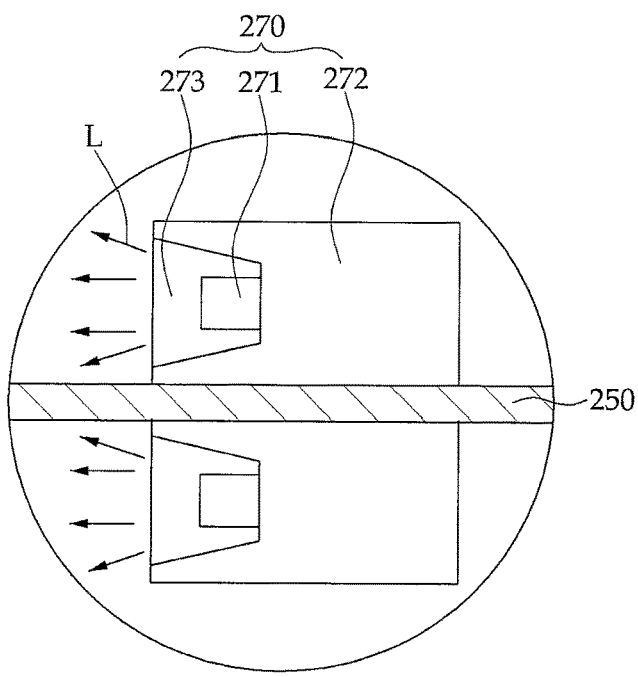
FIG. 5 is a cross-sectional view illustrating a light source unit according to another embodiment of the present invention.
Figure 6:
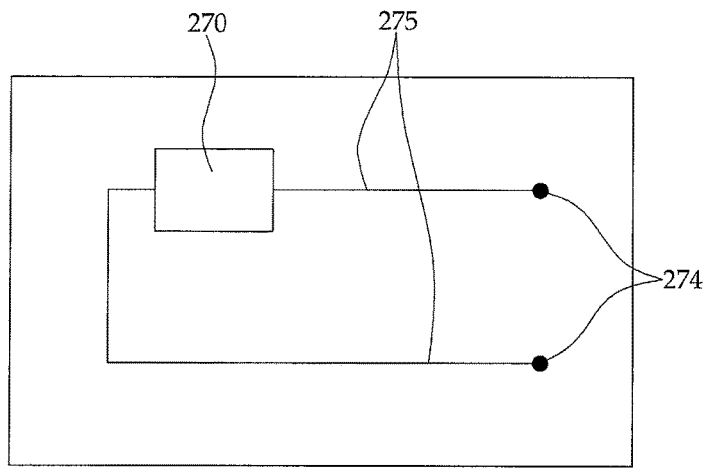
FIG. 6 is a schematic plan view illustrating the light source unit mounted on a flexible printed circuit board.

As illustrated in FIGS. 4 and 5, the light source unit 270 includes a light source 271, a housing 272, and a molding portion 273. Further, the light source unit 270 further includes an electrode portion (e.g., an electrode) configured to supply power to the light source 271.

The light source unit 270 may have a total height in a range of about 0.1 mm to about 1 mm. Therefore, an overall width of the display device 10 is not increased even though the light source unit 270 is disposed in the pad region NA of the display device 10.

Light emitted from the light source unit 270 may be directed upward and/or downward (e.g., in a direction normal to the first substrate 11) as illustrated in FIG. 4, or may be directed sideways (e.g., horizontally or in a direction parallel to the first substrate 110) as illustrated in FIG. 5. The light emission direction may be determined by considering curing efficiency of the resin 230.

The light source 271 may be a UV light source, such as a UV LED. For example, the light source 271 may have a UV light output in a range of about 100 mW/cm$^2$ to about 4000 mW/cm$^2$, and it may output light having a wavelength (e.g., a single wavelength) of 365 nm or 385 nm or multiple wavelengths of 365 nm and 385 nm.

The light source 271 is mounted on the housing 272. The molding portion 273 is configured to direct (e.g., mold) light outputted by the light source 271. The housing 272 and the molding portion 273 may be configured in various forms. For example, the housing 272 may include a printed circuit board (PCB). A part of the molding portion 273 may have a lens shape and a phosphor may be provided inside the molding portion 273.

The light source unit 270 is mounted on the second connection unit 250. As illustrated in FIG. 6, the light source unit 270 is coupled to a power source line 274 (e.g., a power source) on the second connection unit 250, and a terminal portion 275 (e.g., a terminal) is formed on one end portion of the power source line 274. A controller configured to turn on or off the light source unit 270 is disposed on the second connection unit 250. When an external power terminal is coupled to (e.g., connected to) the terminal portion 275 of the second connection unit 250 so as to supply power to the light source unit 270, UV light may be irradiated to the resin 230 by the light source unit 270 so that the resin 230 is cured.

For instance, the curing process starts to be performed by the light source unit 270 after the resin 230 is coated on the display panel, and the display panel and the window 400 are bonded to each other. The external power terminal applies power to the terminal portion 275 of the light source unit 270 at the same time as UV light is irradiated from the outside of the display device 10 to the resin 230 thereof or with a time difference so that the resin 230 in the pad area NA is irradiated with the UV light by the light source unit 270. When the external light source completes the UV light irradiation, the light source unit 270 also completes the UV light irradiation. The terminal portion 275 of the light source unit 270 is separated from (e.g., disconnected or uncoupled from) the external power terminal and then remains in the display device 10 in a state of being turned off.

The resin 230 in the pad area NA is effectively cured through the curing process using the light source unit 270 as described above.

Hereinafter, a pixel configuration will be described according to an embodiment of the present invention with reference to FIG. 7.

Figure 7:
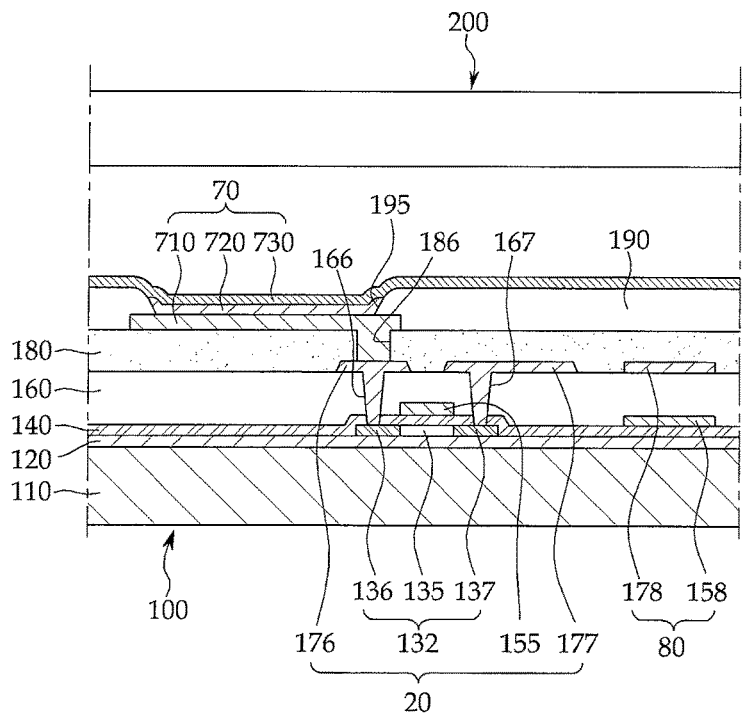
FIG. 7 is a cross-sectional view illustrating a configuration of a pixel in the B area of FIG. 1.

FIG. 7 is a cross-sectional view illustrating a configuration of a pixel in the B area of FIG. 1.

Referring to FIG. 7, the first substrate 110 is an insulating substrate made of glass, quartz, ceramic, or plastic, but the present invention is not limited thereto. The first substrate 110 may be a conductive metal substrate made of, for example, stainless steel.

A buffer layer 120 is disposed on the first substrate 110. The buffer layer 120 may serve to prevent undesirable elements, such as impurities, from penetrating from the first substrate 110, may planarize a surface of the first substrate 110, and may be made of various different materials suitable for performing such functions. For example, the buffer layer 120 may be made of at least one selected from the group consisting of silicon nitride ($SiN_x$), silicon dioxide ($SiO_2$), and/or a silicon oxynitride ($SiO_xN_y$). However, the buffer layer 120 is not always necessary and may not be provided according to the kinds and/or process conditions of the first substrate 110.

A semiconductor layer 132 is disposed on the buffer layer 120. The semiconductor layer 132 may be made of at least one semiconductor material selected from the group consisting of a polycrystalline silicon layer, an amorphous silicon layer, and an oxide semiconductor, such as indium gallium zinc oxide (IGZO) and/or indium zinc tin oxide (IZTO). For instance, when the semiconductor layer 132 is made of the polycrystalline silicon layer, the semiconductor layer 132 includes a channel area 135 that is not doped with impurities and p+ doped drain and source areas 136 and 137 on the respective sides of the channel area 135. In one embodiment, p-type impurities, such as boron (B), are used as dopant ions and $B_2H_6$ is generally used. Herein, such impurities vary depending on the kinds of thin film transistors (TFTs).

According to the first embodiment of the present invention, a PMOS-structured TFT using the p-type impurities is used as a TFT 20, but the present invention is not limited thereto. A NMOS-structured or CMOS-structured TFT may also be used as the TFT 20. Further, the TFT 20 may be a polycrystalline TFT, an amorphous TFT including an amorphous silicon layer, or an oxide semiconductor TFT.

A gate insulating layer 140 made of silicon nitride ($SiN_x$) or silicon dioxide ($SiO_2$) is disposed on the semiconductor layer 132. The gate insulating layer 140 may include at least one selected from the group consisting of tetraethyl orthosilicate (TEOS), silicon nitride ($SiN_x$), and silicon oxide ($SiO_2$). For instance, the gate insulating layer 140 may have a double layer structure in which a silicon nitride layer having a thickness of about 40 nm and a TEOS layer having a thickness of about 80 nm are sequentially laminated, but the structure of the gate insulating layer 140 is not limited thereto.

A gate wire including a gate electrode 155 is disposed on the gate insulating layer 140. The gate wire further includes a gate line, a first storage electrode 158, and other wires. The gate electrode 155 is disposed to overlap at least a part of the semiconductor layer 132 and, for example, to overlap the channel area 135. The gate electrode 155 may prevent the channel area 135 from being doped with impurities when the drain and source areas 136 and 137 of the semiconductor layer 132 are doped with the impurities in the process of forming the semiconductor layer 132.

The gate electrode 155 and the first storage electrode 158 may be disposed on the same layer and may be made of substantially the same metal material. In this case, the metal material may include at least one selected from the group consisting of molybdenum (Mo), chromium (Cr), and tungsten (W). For example, the gate electrode 155 and the first storage electrode 158 may be made of molybdenum (Mo) or a molybdenum alloy.

An interlayer insulating layer 160 configured to cover the gate electrode 155 is disposed on the gate insulating layer 140. The gate insulating layer 140 and the interlayer insulating layer 160 have a source contact opening 167 (e.g., a source contact hole) to expose the source area 137 of the semiconductor layer 132, and a drain contact opening 166 (e.g., a drain contact hole) to expose the drain area 136 of the semiconductor layer 132. The interlayer insulating layer 160 may be made of tetraethyl orthosilicate (TEOS), silicon nitride ($SiN_x$), or silicon oxide ($SiO_x$) similar to the gate insulating layer 140, but the present invention is not limited thereto.

A data wire including a source electrode 177 and a drain electrode 176 is disposed on the interlayer insulating layer 160. The data wire further includes a data line, a common power source line, a second storage electrode 178, and other wires. The source electrode 177 and the drain electrode 176 are respectively coupled to the source area 137 and the drain area 136 of the semiconductor layer 132 through the contact openings 166 and 167.

The TFT 20 including the semiconductor layer 132, the gate electrode 155, the source electrode 177, and the drain electrode 176 is formed as described above. A capacitor 80 including the first storage electrode 158 and the second storage electrode 178 is also formed. In one embodiment, the interlayer insulating layer 160 is a dielectric material of the capacitor 80.

The configuration of the TFT 20 is not limited to the above-described embodiment and may vary according to known configurations that can be carried out by those skilled in the art.

A planarization layer 180 configured to cover the data wire is disposed on the interlayer insulating layer 160. The planarization layer 180 serves to eliminate steps and to provide a planarized surface for an organic light emitting diode (OLED) 70 in order to increase light emission efficiency of the OLED 70 that is disposed on the planarization layer 180. The planarization layer 180 has a pixel electrode contact opening 186 (e.g., a pixel electrode contact hole) to expose a part of the drain electrode 176.

The planarization layer 180 may be made of at least one selected from the group consisting of a polyacrylate resin, an epoxy resin, a phenolic resin, a polyamide resin, a polyimide resin, an unsaturated polyester resin, a polyphenylenether resin, a polyphenylene sulfide resin, and benzocyclobutene (BCB).

A pixel electrode 710 of the OLED 70 is disposed on the planarization layer 180. Herein, the pixel electrode 710 serves as an anode. The pixel electrode 710 is coupled to the drain electrode 176 through the contact opening 186 of the planarization layer 180.

A pixel defining layer (PDL) 190 having an opening to expose the pixel electrode 710 is disposed on the planarization layer 180. That is, the pixel electrode 710 is disposed to correspond to the opening of the PDL 190. The PDL 190 may be made of a polyacrylate resin or a polyimide resin.

An organic light emitting layer 720 is disposed on the pixel electrode 710 in the opening of the PDL 190, and a common electrode 730 is disposed on the PDL 190 and the organic light emitting layer 720.

The OLED 70 including the pixel electrode 710, the organic light emitting layer 720, and the common electrode 730 is formed as described above.

Any one of the pixel electrode 710 and the common electrode 730 may be made of a transparent conductive material and the other may be made of a transflective or reflective conductive material. According to the kinds of materials included in the pixel electrode 710 and the common electrode 730, an organic light emitting diode display may be classified as a top-emission, a bottom-emission, or a dual-emission display.

The transparent conductive material may include at least one selected from the group consisting of Indium Tin Oxide (ITO), Indium Zinc Oxide (IZO), zinc oxide (ZnO), and indium oxide ($In_2O_3$). The reflective material may include at least one selected from the group consisting of lithium (Li), Calcium (Ca), lithium fluoride/Calcium (LiF/Ca), lithium fluoride/aluminum (LiF/Al), aluminum (Al), silver (Ag), magnesium (Mg), and gold (Au).

The organic light emitting layer 720 may include a low molecular weight organic material or a high molecular weight organic material. Further, the organic light emitting layer 720 may be formed to have a multilayer structure including at least one of a hole injection layer (HIL), a hole transporting layer (HTL), an light emission layer, an electron transporting layer (ETL), and an electron injection layer (EIL). For example, the hole injection layer (HIL) is disposed on the pixel electrode 710 serving as an anode, and the hole transporting layer (HTL), the emission layer, the electron transporting layer (ETL), and the electron injection layer (EIL) are sequentially laminated on the hole injection layer (HIL).

The second substrate 200 is disposed on the OLED 70. The second substrate 200 is disposed opposite to (e.g., faces) the first substrate 110 so as to cover the TFT 20 and the OLED 70. The second substrate 200 may be formed to be a transparent insulating substrate made of glass, quartz, or ceramic similar to the first substrate 110. Further, the second substrate 200 may be a sealing member and may have a thin film structure in which an organic layer and an inorganic layer are alternately laminated.

In an embodiment including a liquid crystal display (LCD), the pixel electrode 710 may be physically and electrically coupled to the drain electrode 176 through the contact opening 186 and may receive data voltage from the drain electrode 176. The pixel electrode 710, receiving the data voltage, generates an electric field together with the common electrode, receiving a common voltage, thereby determining a direction (e.g., an orientation) of liquid crystal molecules of a liquid crystal layer between the two electrodes. The pixel electrode 710 and the common electrode form a capacitor (hereinafter referred to as a "liquid crystal capacitor") so as to maintain the applied voltage after the TFT is turned off.

Hereinafter, according to another embodiment of the present invention, a display device will be described with reference to FIG. 8, and descriptions of the same elements and/or configurations as that of the previous embodiments of the display device may not be provided. The touch unit 210 is not present in this embodiment of the present invention.

Figure 8:
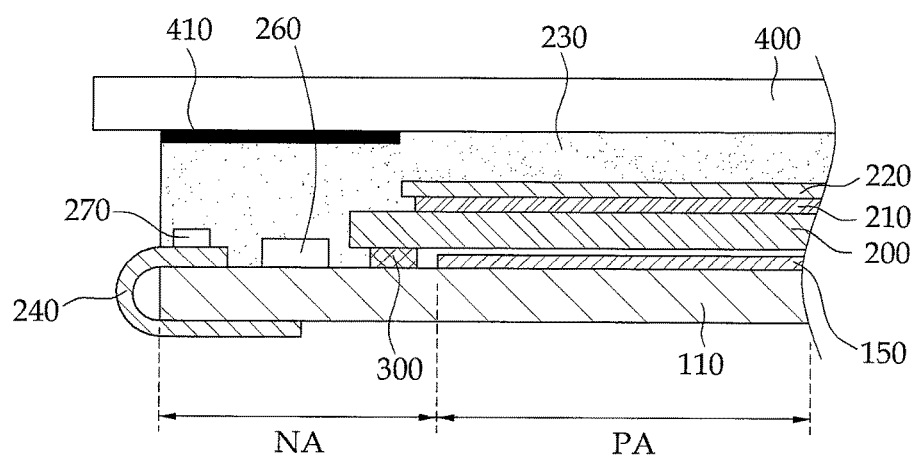
FIG. 8 is a cross-sectional view of a display device according to an embodiment of the present invention.

FIG. 8 is a cross-sectional view of the display device according to another embodiment of the present invention.

Referring to FIG. 8, the display device 10 may include a first connection unit 240. The light source unit 270 may be disposed on the first connection unit 240. The light source unit 270 may assist in curing the resin 230 in the pad area NA.

Hereinafter, according to another embodiment of the present invention, a display device will be described with reference to FIG. 9, and repeated descriptions of the same elements and/or configurations as that of the previous embodiments of the display device may not be provided. The touch unit 210 is present in this embodiment of the present invention.

Figure 9:
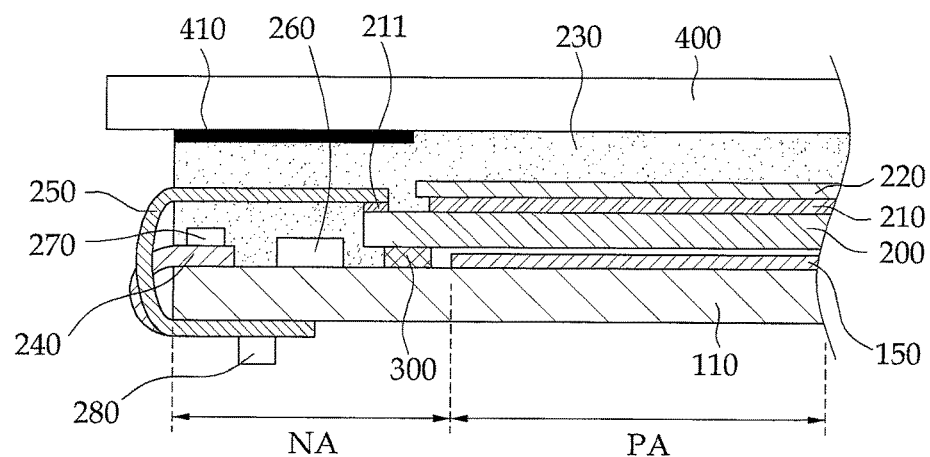
FIG. 9 is a cross-sectional view of a display device according to an embodiment of the present invention.

FIG. 9 is a cross-sectional view of the display device according to another embodiment of the present invention.

Referring to FIG. 9, the light source unit 270 may be disposed only on the first connection unit 240. The light source unit 270 may assist in curing the resin 230 in the pad area NA.

Hereinafter, according to another embodiment of the present invention, a display device will be described with reference to FIG. 10, and repeated descriptions of the same elements and/or configurations as that of the previous embodiments of the display device may not be provided. The touch unit 210 is present in this embodiment of the present invention.

Figure 10:
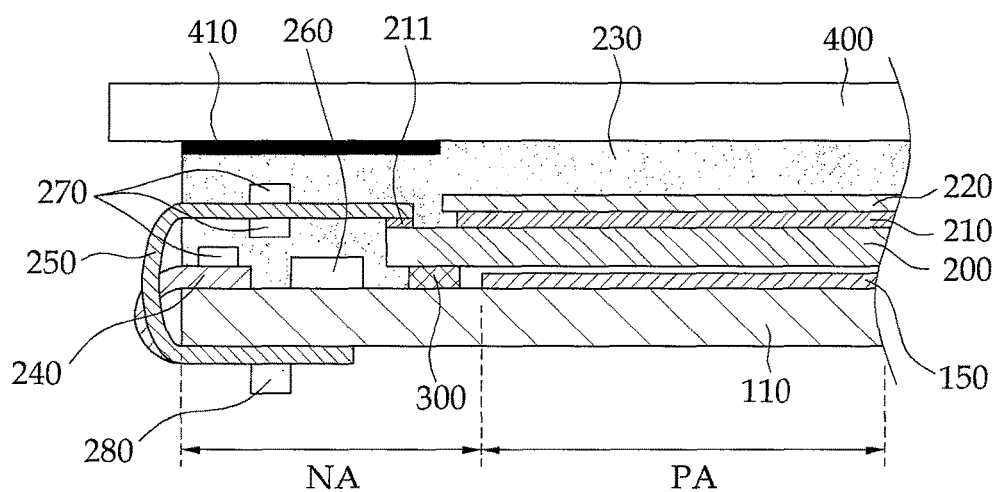
FIG. 10 is a cross-sectional view of a display device according to an embodiment of the present invention.

FIG. 10 is a cross-sectional view of the display device according to another embodiment of the present invention.

Referring to FIG. 10, the light source unit 270 may be disposed on both the first and second connection units 240 and 250. The light source unit 270 may assist in curing the resin 230 in the pad area NA.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims and equivalents thereof.

What is claimed is:

1. A display device comprising:
a first substrate comprising a display area and a pad area;
a second substrate facing the first substrate;
a touch unit on the second substrate;
a window over the touch unit, the window covering the display area and the pad area;
a black matrix on a lower surface of the window over the pad area;
a photo-curable adhesive resin layer filling a space between the window and the first substrate under the black matrix; and
an ultraviolet light source between the first substrate and the window under the black matrix, the ultraviolet light source being buried in the photo-curable adhesive resin layer and configured to cure the photo-curable adhesive resin layer,
wherein the ultraviolet light source is above the first substrate and below the window in an emission direction of the display area.

2. The display device of claim 1, wherein the photo-curable adhesive resin layer fills a space between the touch unit and the window.

3. The display device of claim 1, further comprising a first connector coupled to the first substrate at the pad area.

4. The display device of claim 3, wherein the ultraviolet light source is on one surface of the first connector.

5. The display device of claim 4, further comprising a second connector coupled to the second substrate and coupled to the touch unit.

6. The display device of claim 5, further comprising a second light source unit on at least one surface of the second connector.

7. The display device of claim 6, further comprising a third light source unit,
wherein the second light source unit is on a surface of the second connector and the third light source unit is on another surface of the second connector.

8. The display device of claim 3, wherein the first connector comprises a flexible printed circuit board.

9. The display device of claim 1, further comprising a second connector coupled to the second substrate and coupled to the touch unit.

10. The display device of claim 9, wherein the ultraviolet light source is on at least one surface of the second connector.

11. The display device of claim 10, further comprising a second light source unit,
wherein the ultraviolet light source is on one surface of the second connector, and the second light source unit is on another surface of the second connector.

12. The display device of claim 9, wherein the second connector comprises a flexible printed circuit board.

13. The display device of claim 1, wherein the touch unit is at a location corresponding to the display area.

14. The display device of claim 1, further comprising a polarizer between the touch unit and the window.

15. The display device of claim 1, wherein the ultraviolet light source has a height in a range of 0.1 mm to 1 mm.

16. The display device of claim 1, wherein the ultraviolet light source is configured to emit light along a direction normal to the first substrate.

17. The display device of claim 1, wherein the ultraviolet light source is configured to emit light along a direction parallel to the first substrate.

18. The display device of claim 1, further comprising an ultraviolet light source housing and an ultraviolet light source molding portion.

19. The display device of claim 18, wherein the ultraviolet light source molding portion is configured to direct light emitted from the ultraviolet light source in a defined direction.

* * * * *